(12) United States Patent
Kim et al.

(10) Patent No.: US 10,622,414 B2
(45) Date of Patent: Apr. 14, 2020

(54) ELECTROLUMINESCENT DISPLAY DEVICE

(71) Applicant: LG DISPLAY CO., LTD., Seoul (KR)

(72) Inventors: Jin-Tae Kim, Paju-si (KR); Keum-Kyu Min, Paju-si (KR); Soo-Kang Kim, Paju-si (KR); Kang-Ju Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/118,078

(22) Filed: Aug. 30, 2018

(65) Prior Publication Data

US 2019/0067381 A1 Feb. 28, 2019

(30) Foreign Application Priority Data

Aug. 31, 2017 (KR) ........................ 10-2017-0110947

(51) Int. Cl.
*H01L 51/52* (2006.01)
*H01L 27/32* (2006.01)
*H01L 51/50* (2006.01)

(52) U.S. Cl.
CPC ........ *H01L 27/322* (2013.01); *H01L 27/3246* (2013.01); *H01L 27/3258* (2013.01); *H01L 51/5012* (2013.01); *H01L 51/5206* (2013.01); *H01L 51/5209* (2013.01); *H01L 51/5221* (2013.01); *H01L 51/5225* (2013.01); *H01L 51/5275* (2013.01)

(58) Field of Classification Search
CPC ............... H01L 27/322; H01L 51/5275; H01L 27/3246
See application file for complete search history.

(56) References Cited

U.S. PATENT DOCUMENTS

| | | | |
|---|---|---|---|
| 2004/0207570 A1 | 10/2004 | Nishikawa et al. | |
| 2005/0089772 A1* | 4/2005 | Kawaguchi | G02B 5/201 430/7 |
| 2007/0222375 A1* | 9/2007 | Liu | H01L 27/322 313/506 |
| 2012/0127140 A1* | 5/2012 | Ryan | G09G 3/3648 345/207 |
| 2012/0218173 A1* | 8/2012 | Ohta | G02B 3/0056 345/76 |
| 2013/0038205 A1 | 2/2013 | Nakamura et al. | |
| 2014/0166997 A1 | 6/2014 | Kim et al. | |
| 2014/0175399 A1 | 6/2014 | Choi et al. | |
| 2014/0312339 A1* | 10/2014 | Fujita | H01L 27/322 257/40 |

(Continued)

FOREIGN PATENT DOCUMENTS

DE 102016120636 A1 5/2017
WO WO-2011121668 A1 * 10/2011 ......... H01L 51/5275

*Primary Examiner* — Donald L Raleigh
(74) *Attorney, Agent, or Firm* — Birch, Stewart, Kolasch & Birch, LLP

(57) ABSTRACT

An electroluminescent display device can include a substrate including a first emission area and a first non-emission area; a first color filter pattern on the substrate and in the first emission area; a first wall disposed in the first non-emission area and surrounding the first color filter pattern; an overcoat layer on the first wall and the first color filter pattern and including a first micro-lens structure having a non-flat surface in the first emission area; and a light emitting diode on the overcoat layer and in the first emission area.

22 Claims, 5 Drawing Sheets

(56) References Cited

U.S. PATENT DOCUMENTS

| | | | |
|---|---|---|---|
| 2015/0001576 A1* | 1/2015 | Iwata | H01L 51/5246 257/100 |
| 2015/0221894 A1* | 8/2015 | Setz | G02B 3/005 359/320 |
| 2016/0087018 A1* | 3/2016 | Shim | H01L 51/5275 257/40 |
| 2017/0062770 A1* | 3/2017 | Jang | H01L 51/56 |
| 2017/0125489 A1* | 5/2017 | Jang | H01L 27/3213 |
| 2017/0125738 A1* | 5/2017 | Kim | H01L 51/5268 |
| 2017/0125742 A1* | 5/2017 | Park | H01L 51/5275 |
| 2018/0190719 A1* | 7/2018 | Kim | H01L 27/322 |

\* cited by examiner

ELECTROLUMINESCENT DISPLAY DEVICE

CROSS-REFERENCE TO RELATED APPLICATIONS

This application claims the benefit under 35 U.S.C. § 119(a) of Korean Patent Application No. 10-2017-0110947, filed in the Republic of Korea on Aug. 31, 2017, which is incorporated herein by reference in its entirety.

BACKGROUND

1. Technical Field

The present disclosure relates to an electroluminescent display device, and more particularly, to an electroluminescent display device including a micro lens array (MLA) with improved reliability.

2. Discussion of the Related Art

Recently, flat panel displays having excellent characteristics, such as being thin, lightweight and having low power consumption, have been widely developed and applied to various fields.

Among the flat panel displays, an electroluminescent display device is a device in which a charge is injected into an emissive layer formed between a cathode, which is an electron-injecting electrode, and an anode, which is a hole-injecting electrode, such that excitons are formed, and then radiative recombination of the excitons occurs such that light is emitted.

The electroluminescent display device is able to be formed even on a flexible substrate, such as plastic, and has an advantage in a contrast ratio due to being a self-emitting type. In addition, the electroluminescent display device can easily realize a dynamic image due to a fast response time of about several microseconds (μs) and has no limit in a viewing angle. Moreover, the electroluminescent display device is stable even at a low temperature, and can be driven at a relatively low voltage of DC 5 V to 15 V, which allows for the manufacture and design of a drive circuit to be more simple given the low driving voltage.

FIG. 1 is a schematic cross-sectional view of a related art electroluminescent display device.

As illustrated in FIG. 1, an electroluminescent display device 1 includes a substrate 10, a thin film transistor Tr disposed on the substrate 10, a light emitting diode D disposed above the substrate 10 and connected to the thin film transistor Tr, and a color filter pattern 50 disposed below the light emitting diode D. The electroluminescent display device may further include an encapsulation layer disposed above the light emitting diode D.

The light emitting diode D includes a first electrode 41, an emitting layer 42, and a second electrode 43, and light from the emitting layer 42 is output to the outside through the first electrode 41.

The light emitted from the emitting layer 42 passes through various configurations of the electroluminescent display device 1 and exits the electroluminescent display device 1.

However, a surface plasmon component generated at a boundary between a metal and the emitting layer 42 and an optical waveguide mode, which is configured by the emitting layer 42 inserted into reflective layers at both sides, accounts for about 60 to 70% of emitted light.

Accordingly, among the light emitted from the emitting layer 42, some light remains trapped inside the electroluminescent display device 1, rather than exiting the electroluminescent display device 1. Thus, there is a problem in that the light extraction efficiency (out-coupling efficiency) of the electroluminescent display device 1 is degraded.

SUMMARY

Accordingly, the present invention is directed to an electroluminescent display that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present disclosure provides an electroluminescent display device including a substrate including a first emission area and a first non-emission area; a first color filter pattern on the substrate and in the first emission area; a wall disposed in the first non-emission area and surrounding the first color filter pattern; an overcoat layer on the wall and the first color filter pattern and including a first micro-lens structure in the first emission area; an emitting diode on the overcoat layer and in the first emission area.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain principles of the invention.

DETAILED DESCRIPTION

Reference will now be made in detail to the embodiments, examples of which are illustrated in the accompanying drawings.

Figure 1:
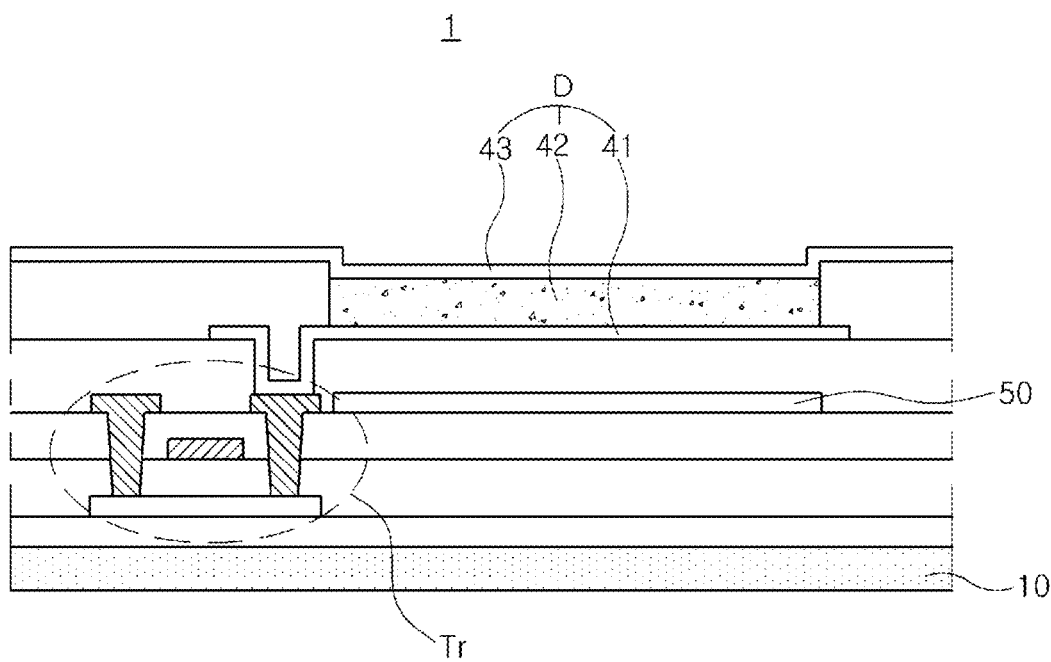
FIG. 1 is a cross-sectional view schematically illustrating a related art electroluminescent display device.
Figure 2:
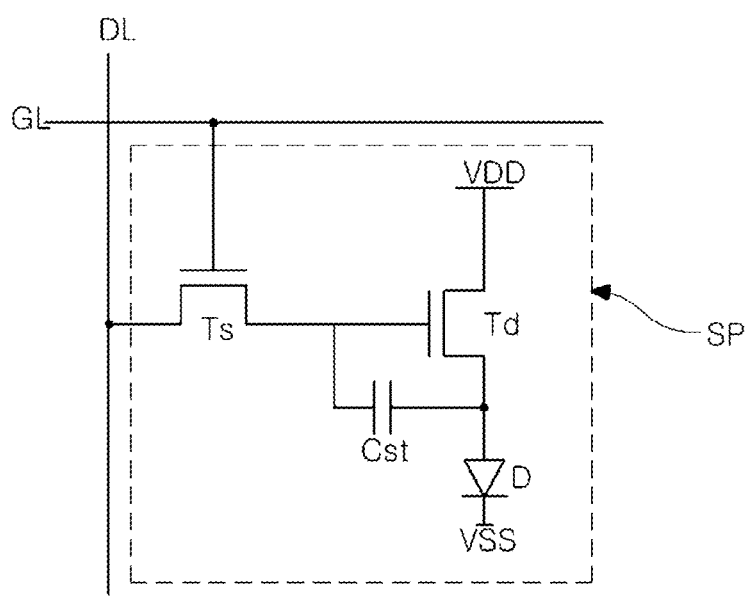
FIG. 2 is a circuit diagram illustrating a single subpixel region of an electroluminescent display device according to an embodiment of the present disclosure.

FIG. 2 is a circuit diagram illustrating a single subpixel region of an electroluminescent display device according to an embodiment of the present disclosure.

As illustrated in FIG. 2, the electroluminescent display device according to an embodiment of the present disclosure includes a gate line GL and a data line DL crossing each other to define a subpixel region SP. A switching thin film transistor Ts, a driving thin film transistor Td, a storage capacitor Cst, and a light emitting diode D are formed in each subpixel region SP.

A gate electrode of the switching thin film transistor Ts is connected to the gate line GL, and a source electrode of the switching thin film transistor Ts is connected to the data line DL. A gate electrode of the driving thin film transistor Td is connected to a drain electrode of the switching thin film transistor Ts, and a drain electrode of the driving thin film transistor Td is connected to a high-potential voltage VDD. An anode of the light emitting diode D is connected to a source electrode of the driving thin film transistor Td, and a cathode is connected to a low-potential voltage VSS. The storage capacitor Cst is connected to the gate electrode and the source electrode of the driving thin film transistor Td.

In an image display operation of such an electroluminescent display device, the switching thin film transistor Ts is turned on in accordance with a gate signal applied through the gate line GL, and a data signal applied to the data line DL is applied to the gate electrode of the driving thin film transistor Td and one electrode of the storage capacitor Cst through the switching thin film transistor Ts.

The driving thin film transistor Td is turned on in accordance with the data signal and controls a current which flows in the light emitting diode D to display an image. The light emitting diode D emits light due to a current of the high-potential voltage VDD transmitted through the driving thin film transistor Td.

That is, since an amount of current in the light emitting diode D is proportional to an amplitude of the data signal, and an intensity of light emitted by the light emitting diode D is proportional to the amount of current in the light emitting diode D, the subpixel region SP displays a grayscale, which differs in accordance with the amplitude of the data signal, and as a result, the electroluminescent display device displays an image.

The storage capacitor Cst serves to maintain a charge which corresponds to the data signal during one frame in order to make an amount of current flowing in the light emitting diode D constant and maintain a grayscale, which the light emitting diode D displays, to be constant.

A transistor and/or a capacitor other than the switching and driving thin film transistors Ts and Td and the storage capacitor Cst may be further added in the subpixel region SP.

Figure 3:
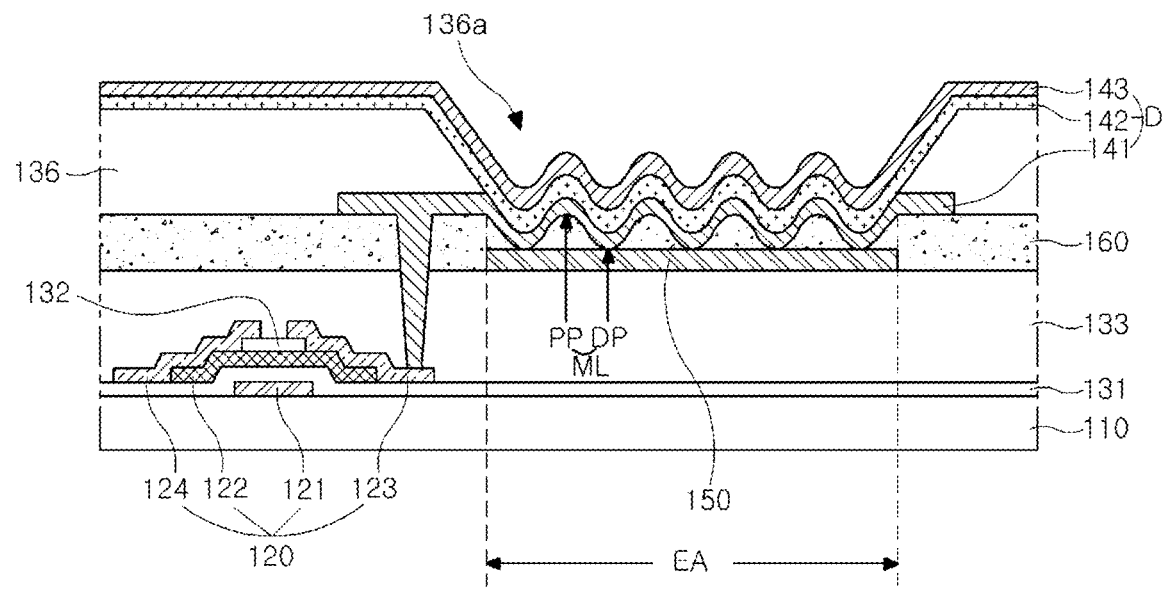
FIG. 3 is a schematic cross-sectional view of an electroluminescent display device according to an embodiment of the present disclosure.
Figure 4:
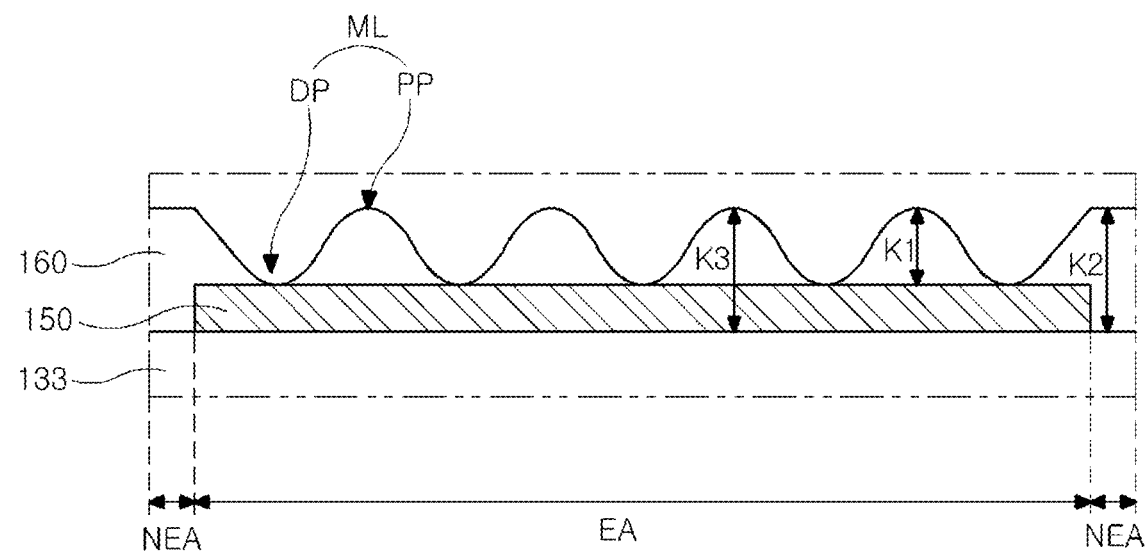
FIG. 4 is a schematic cross-sectional view of a micro lens included in an overcoat layer of the electroluminescent display device according to an embodiment of the present disclosure.

FIG. 3 is a schematic cross-sectional view of an electroluminescent display device according to a first embodiment of the present disclosure, and FIG. 4 is a cross-sectional view of a micro lens included in an overcoat layer of the electroluminescent display device according to the first embodiment of the present disclosure.

As illustrated in FIG. 3, an electroluminescent display device 100 according to the first embodiment of the present disclosure can include a substrate 110, a thin film transistor 120, a color filter pattern 150, an overcoat layer 160, and a light emitting diode D electrically connected to the thin film transistor 120.

The electroluminescent display device 100 according to the first embodiment of the present disclosure is illustrated as being a bottom emission type in which light from an emitting layer 142 is output to the outside through a first electrode 141, but embodiments are not limited thereto.

That is, the electroluminescent display device 100 according to the first embodiment of the present disclosure can also be a top emission type. In the top emission type electroluminescent display device 100, the color filter pattern 150 is located on or over on the light emitting diode D, and light from the emitting layer 142 is output to the outside through a second electrode 143.

When the electroluminescent display device 100 is the top emission type, a reflective electrode or a reflective layer can be further formed below the first electrode 141. For example, the reflective electrode or the reflective layer can be formed of an aluminum-palladium-copper (APC) alloy. In this instance, the second electrode 143 can have a relatively small thickness for light to transmit therethrough.

The electroluminescent display device 100 according to the first embodiment of the present disclosure can include the thin film transistor 120 on the substrate 110. The thin film transistor 120 includes a gate electrode 121, an active layer 122, a source electrode 123, and a drain electrode 124.

Specifically, the gate electrode 121 of the thin film transistor 120 and a gate insulating layer 131 can be disposed on the substrate 110.

The active layer 122, which overlaps the gate electrode 121, can be disposed on the gate insulating layer 131.

An etch stopper 132 for protecting a channel area of the active layer 122 can be disposed on the active layer 122.

The source electrode 123 and the drain electrode 124, which contact with the active layer 122, may be disposed on the active layer 122.

The electroluminescent display device to which the embodiments of the present disclosure are applicable is not limited to that illustrated in FIG. 3. The electroluminescent display device can further include a buffer layer disposed between the substrate 110 and the active layer 122, and the etch stopper 132 may be omitted.

For convenience of description, only the driving thin film transistor has been illustrated from among various thin film transistors that can be included in the electroluminescent display device 100. Although the thin film transistor 120 will be described as having an inverted staggered structure (or bottom gate structure) in which, with respect to the active layer 122, the gate electrode 121 is disposed to be opposite to the source electrode 123 and the drain electrode 124, this is merely an example. A thin film transistor, which has a coplanar structure (or top gate structure) in which, with respect to the active layer 122, the gate electrode 121 is disposed to be collinear with the source electrode 123 and the drain electrode 124, can also be used.

A protective layer 133 can be disposed on the drain electrode 124 and the source electrode 123, and the color filter pattern 150 may be disposed above the protective layer 133.

The protective layer 133 is illustrated as having a flat top surface. Alternatively, the protective layer 133 can also be disposed along the shapes of surfaces of configurations located below the protective layer 133.

The color filter pattern 150 is configured to change (or filter) a color of light emitted from the emitting layer 142, and may be one of a red color filter pattern, a green color filter pattern, and a blue color filter pattern.

The color filter pattern 150 on the protective layer 133 can be disposed to correspond to an emission area EA. Alternatively, the color filter pattern 150 may only be disposed in portions of the emission area EA.

Emission area EA refers to an area in which the emitting layer 142 emits light by the first electrode 141 and the second electrode 143, and the color filter pattern 150 being disposed at a position corresponding to the emission area EA means that the color filter pattern 150 is disposed to prevent a blurring phenomenon and a ghost phenomenon which occur due to mixing of light emitted from adjacent emission areas EA.

For example, the color filter pattern 150 can be disposed to overlap the emission area EA and have a size smaller than or equal to that of the emission area EA.

However, the arrangement position and size of the color filter pattern 150 can be determined by various factors, such as a distance between the color filter pattern 150 and the first electrode 141, a distance between the color filter pattern 150 and each protruding portion PP and depressed portion DP of a micro lens included in the overcoat layer 160, and a distance between an emission area EA and another emission area EA, as well as the size and position of the emission area EA.

A pixel of the electroluminescent display device 100 can include one or more subpixels. For example, a single pixel can include two to four subpixels.

A subpixel refers to a unit in which a specific type of color filter pattern 150 is formed or a unit in which a light emitting diode D is formed that is capable of emitting a particular color without a color filter pattern.

Colors defined in a subpixel can include red (R), green (G), blue (B), and optionally white (W), but embodiments are not limited thereto.

The overcoat layer 160 can be disposed on the color filter pattern 150 and the protective layer 133.

The protective layer 133 may be omitted. That is, the overcoat layer 160 may be disposed on the thin film transistor 120.

The color filter pattern 150 is illustrated as being disposed on the protective layer 133, but embodiments are not limited thereto. The color filter pattern 150 can be disposed at any position between the overcoat layer 160 and the substrate 110.

Particularly, in order to improve light extraction efficiency in the electroluminescent display device 100 according to the first embodiment of the present disclosure, the micro lens (micro-lens structure) ML can be disposed in the overcoat layer 160 corresponding to the emission area EA.

The micro lens ML can include a plurality of recessed portions DP and a plurality of protruding portions PP, but embodiments are not limited thereto, and the micro lens ML can have various other shapes.

For example, a micro lens including a plurality of protruding portions PP and connecting portions configured to connect adjacent protruding portions PP can be formed in the overcoat layer 160.

In an area in which the plurality of recessed portions DP and the plurality of protruding portions PP are not disposed, the overcoat layer 160 serves as a planarization layer.

Each of the plurality of recessed portions DP can have various shapes in a plane view, such as a hexagonal shape, a semicircular shape, a semielliptical shape, and a quadrilateral shape. For example, each of the plurality of recessed portions DP can have a circular divot shape, while each of the plurality of protruding portions PP can take the form of a raised wavy shape between the divots (e.g., see FIG. 7 and FIG. 8, the micro-lens structure can have an egg crate or egg carton type of shape).

The light emitting diode D including the first electrode 141, the emitting layer 142, and the second electrode 143 can be disposed on the overcoat layer 160.

To block the diffusion of outgassing from the overcoat layer 160 to the light emitting diode D, a second protective layer having an insulating property can be disposed between the overcoat layer 160 and the first electrode 141.

Namely, the second protective layer, which follows the morphology of the plurality of recessed portions DP and the plurality of protruding portions PP of the overcoat layer 160, can be disposed between the overcoat layer 160 and the first electrode 141.

The first electrode 141 can be disposed on the overcoat layer 160.

The first electrode 141 may be an anode or cathode for supplying one of an electron or a hole to the emitting layer 142.

A situation in which the first electrode 141 of the electroluminescent display device according to the first embodiment of the present disclosure is an anode will be described as an example.

The first electrode 141 can be formed of a conductive material having a relatively high work function value. For example, the first electrode 141 can be formed of a transparent conductive material such as indium-tin-oxide (ITO) and indium-zinc-oxide (IZO).

The first electrode 141 may be connected to the source electrode 123 of the thin film transistor 120 through a contact hole formed in the overcoat layer 160 and may be separately formed for each pixel region.

In the electroluminescent display device 100 according to the first embodiment of the present disclosure, the thin film transistor 120 is an N-type thin film transistor in which the first electrode 141 is connected to the source electrode 123, but embodiments are not limited thereto. When the thin film transistor 120 is a P-type thin film transistor, the first electrode 141 can also be connected to the drain electrode 124.

The first electrode 141 can also be electrically connected to the emitting layer 142 by being adjacent to the emitting layer 142 with a conductive material therebetween.

The first electrode 141 is disposed in a shape which follows the morphology of a surface of the overcoat layer 160. Namely, the shape of the micro lens ML is reflected onto the first electrode 141.

That is, the first electrode 141 can be disposed in a form which follows the morphology of the plurality of recessed portions DP and the plurality of protruding portions PP of the overcoat layer 160 (e.g., both can have a same wavy pattern or a same bumpy pattern, which match each other).

A bank layer 136 can be disposed on the overcoat layer 160 and the first electrode 141. The bank layer 136 may include an opening 136a exposing the first electrode 141. The bank layer 136 can be disposed between adjacent pixel (or subpixel) areas and serve to differentiate the adjacent pixel (or subpixel) areas.

In this instance, the plurality of recessed portions DP and the plurality of protruding portions PP of the overcoat layer 160 can be disposed in the opening 136a of the bank layer 136.

That is, since the plurality of recessed portions DP and the plurality of protruding portions PP of the overcoat layer 160 are disposed to overlap with the color filter pattern 150, the plurality of recessed portions DP and the plurality of protruding portions PP of the overcoat layer 160 can overlap the color filter pattern 150, which is disposed below the plurality of recessed portions DP and the plurality of protruding portions PP, and overlap the opening 136a of the bank layer 136, which is disposed above the plurality of recessed portions DP and the plurality of protruding portions PP.

The emitting layer 142 can be disposed on the exposed first electrode 141.

The emitting layer 142 can have a tandem white structure in which a plurality of emitting layers are stacked to emit white light. For example, the emitting layer 142 can include a first emitting layer configured to emit blue light and a second emitting layer disposed on the first emitting layer and configured to emit light having a color which turns white when mixed with blue. The second emitting layer may be an emitting layer configured to emit yellow-green light.

The emitting layer 142 may only include emitting layers that emit one of blue light, red light, and green light. In this instance, the electroluminescent display device may not include the color filter pattern 150.

In this instance, an emitting material of the emitting layer 142 can be an organic emitting material or an inorganic emitting material, such as a quantum dot.

Also, the emitting layer 142 can have a shape which follows the morphology of the overcoat layer 160 (e.g., both can have a same bumpy or wavy pattern).

The second electrode 143 for supplying one of an electron or a hole to the emitting layer 142 can be disposed on the emitting layer 142.

In this instance, the second electrode 143 may be an anode or a cathode. A situation in which the second electrode 143 of the electroluminescent display device 100 according to the first embodiment of the present disclosure is a cathode will be described as an example.

The second electrode 143 can be formed of a conductive material having a relatively low work function value and may be located on an entire surface of a display area. For example, the second electrode 143 may be formed of Al, Mg, Ag, or an alloy thereof, but it is not limited thereto.

The second electrode 143 can have a shape which follows the morphology of the overcoat layer 160 (e.g., both can have a same bumpy or wavy pattern).

The first electrode 141, the emitting layer 142, and the second electrode 143 are included in the light emitting diode D, and the light emitting diode D follows the morphology of the plurality of recessed portions DP and the plurality of protruding portions PP of the overcoat layer 160 (e.g., similar to a piece of lasagna).

The shape of the light emitting diode D can be realized using the plurality of recessed portions DP and the plurality of protruding portions PP of the overcoat layer 160.

In this instance, the overcoat layer 160 has a first thickness K1 (a distance from a top surface of the color filter pattern 150 to a peak of the plurality of the protruding portions PP of the overcoat layer 160) in the emission area EA and the overcoat layer 160 has a second thickness K2 (a distance from a top surface of the protective layer 133 to a flat top surface of the overcoat layer 160) in the non-emission area. The first thickness K1 in the emission area is smaller than the second thickness K2 in the non-emission area.

The overcoat layer 160 can have a third thickness K3 (a distance from the top surface of the protective layer 133 (and/or a bottom surface of the color filter pattern 150) to the peak of the plurality of protruding portions PP of the overcoat layer 160). The third thickness K3 can be greater than or equal to the second thickness K2. Namely, a height of the overcoat layer 160 from the substrate 110 (or the protective layer 133) in the emission area EA can be greater than or equal to a height of the overcoat layer 160 from the substrate 110 (or the protective layer 133) in the non-emission area NEA.

As described above, the overcoat layer 160, which includes the micro lens ML including the plurality of recessed portions DP and the plurality of protruding portions PP, is disposed in the electroluminescent display device 100 according to the first embodiment of the present disclosure. Accordingly, light, which has not been extracted to the outside due to total reflection of the light inside the first electrode 141 and the emitting layer 142, among light emitted from the emitting layer 142 can be made to travel at an angle which is smaller than a total reflection critical angle. For example, the micro-lens structure can have a non-flat surface or interface between layers that is configured to vary a critical angle above which total internal reflection occurs. In order to allow more light to escape out of the electroluminescent display device. In other words, out of all of the light generated by the emitting layer 142, some of that light is reflected back inside the emitting layer 142, which normally would never be able to escape (e.g., trapped light), but it can bounce around until it hits a better angle (e.g., less than the critical angle) on one of the bumps or depressions of the micro-lens structure and finally get reflected to the outside. In this way, external luminous efficiency can be improved through multiple reflections.

To form the plurality of recessed portions DP and the plurality of protruding portions PP at the overcoat layer 360 corresponding to the emission area EA, after a photoresist is coated and patterned by a photolithography process, a heat treatment is performed. In this instance, there is a problem in that the first thickness K1 of the overcoat layer 160 corresponding to the emission area EA is not formed thick enough.

Figure 5:
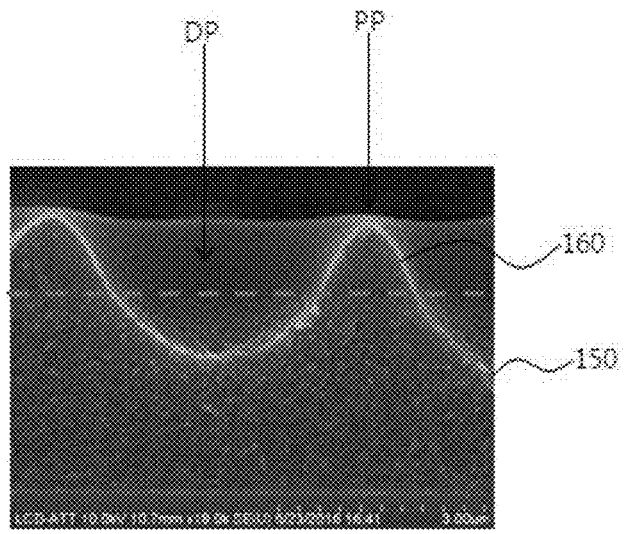
FIG. 5 is a picture showing a color filter pattern that has been damaged in a process of forming a micro lens of the overcoat layer.

FIG. 5 is a picture showing a color filter pattern damaged in a process of forming a micro lens of the overcoat layer.

As illustrated in FIG. 5, due to an insufficient first thickness K1 of the overcoat layer 160 in the process of forming the recessed portions DP of the overcoat layer 160, the color filter pattern 150 disposed below the overcoat layer 160 may be exposed and damaged in the heat treatment process (e.g., the depressions extend too far and etch into the color filter pattern 150, the overcoat layer 160 can become pitted from the heat).

Such damage on the color filter pattern 150 is recognized as a black spot in an image and causes degradation of image quality of the electroluminescent display device 100.

Hereinafter, description will be given, according to a second embodiment, of an electroluminescent display device capable of improving the light extraction efficiency and preventing occurrence of a black spot.

Hereinafter, detailed description of configurations identical or similar to those of the first embodiment may be omitted.

Figure 6:
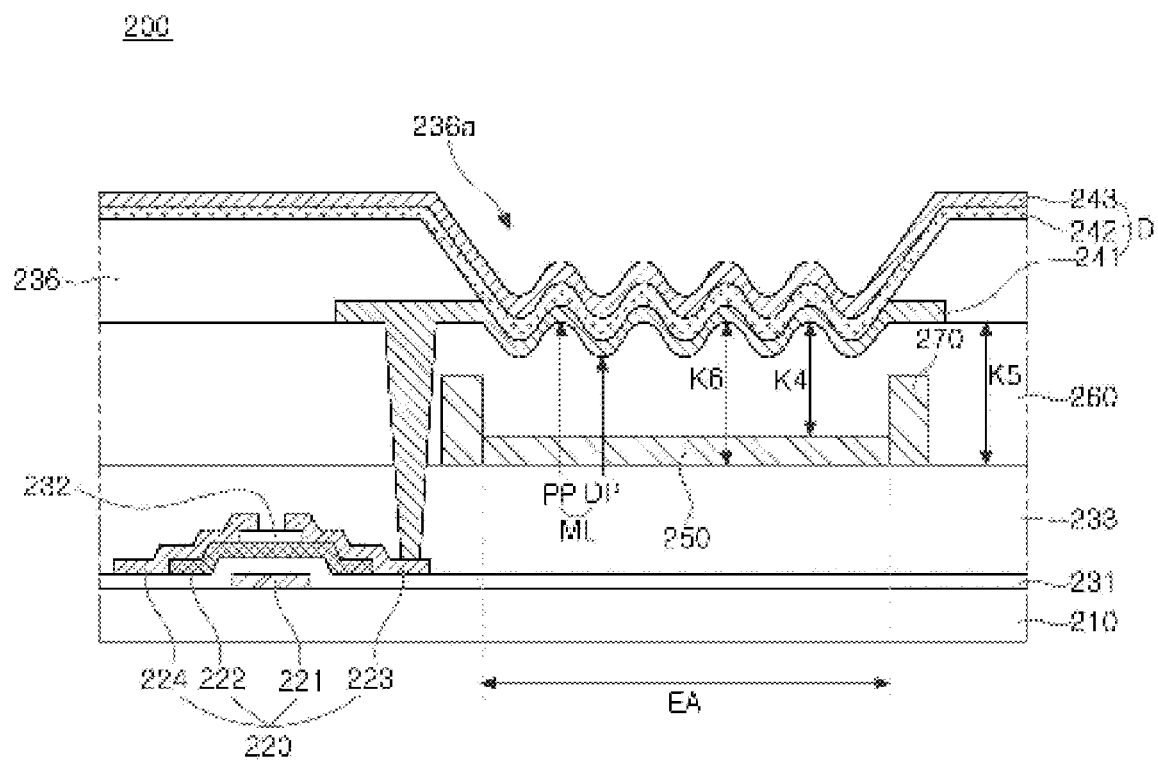
FIG. 6 is a schematic cross-sectional view of an electroluminescent display device according to another embodiment of the present disclosure.

FIG. 6 is a schematic cross-sectional view of an electroluminescent display device according to a second embodiment of the present disclosure.

As illustrated in FIG. 6, an electroluminescent display device 200 according to the second embodiment of the present disclosure includes a substrate 210, a thin film transistor 220, a color filter pattern 250, an overcoat layer 260, and a light emitting diode D electrically connected to the thin film transistor 220.

The electroluminescent display device 200 according to the second embodiment of the present disclosure is illustrated as being a bottom emission type in which light from an emitting layer 242 is output to the outside through a first electrode 241, but embodiments are not limited thereto.

That is, the electroluminescent display device 200 according to the second embodiment of the present disclosure can also be a top emission type. In the top emission type electroluminescent display device 100, the color filter pattern 250 is located on or over on the light emitting diode D, and light from the emitting layer 242 is output to the outside through a second electrode 243.

When the electroluminescent display device 200 is the top emission type, a reflective electrode or a reflective layer can be added below the first electrode 241. For example, the reflective electrode or the reflective layer may be formed of an APC alloy. In this instance, the second electrode 243 can have a relatively small thickness for light to transmit therethrough.

The electroluminescent display device 200 according to the second embodiment of the present disclosure can include the thin film transistor 120 on the substrate 110. The thin film transistor 120 includes a gate electrode 221, an active layer 222, a source electrode 223, and a drain electrode 224.

Specifically, the gate electrode 221 of the thin film transistor 220 and a gate insulating layer 231 can be disposed on the substrate 210.

The active layer 222, which overlaps the gate electrode 221, may be disposed on the gate insulating layer 231.

An etch stopper 232 for protecting a channel area of the active layer 222 can be disposed on the active layer 222.

The source electrode 223 and the drain electrode 224, which come into contact with the active layer 222, may be disposed on the active layer 222.

The electroluminescent display device 200 to which the embodiments of the present disclosure are applicable is not limited to that illustrated in FIG. 6. The electroluminescent display device 200 can further include a buffer layer disposed between the substrate 210 and the active layer 222, and the etch stopper 232 may be omitted.

For convenience of description, only the driving thin film transistor has been illustrated from among various thin film transistors that can be included in the electroluminescent display device 200. Although the thin film transistor 220 will be described as having an inverted staggered structure (or bottom gate structure) in which, with respect to the active layer 222, the gate electrode 221 is disposed opposite the source electrode 223 and the drain electrode 224, this is merely an example, and a thin film transistor, which has a coplanar structure (or top gate structure) in which, with respect to the active layer 222, the gate electrode 221 is disposed to be collinear with the source electrode 223 and the drain electrode 224, can also be used.

A protective layer 233 may be disposed on the drain electrode 224 and the source electrode 223, and the color filter pattern 250 can be disposed above the protective layer 233.

The protective layer 233 is illustrated to have a flat top surface. Alternatively, the protective layer 233 can also be disposed along the shapes of surfaces of configurations located below the protective layer 233.

The color filter pattern 250 is configured to change (or filter) a color of light emitted from the emitting layer 242, and may be one of a red color filter pattern, a green color filter pattern, and a blue color filter pattern.

The color filter pattern 250 on the protective layer 233 can be disposed to correspond to an emission area EA. Alternatively, the color filter pattern 250 may only be disposed in portions of the emission area EA.

Emission area EA refers to an area in which the emitting layer 242 emits light by the first electrode 241 and the second electrode 243, and the color filter pattern 250 being disposed at a position corresponding to the emission area EA means that the color filter pattern 250 is disposed to prevent a blurring phenomenon and a ghost phenomenon which occur due to mixing of light emitted from adjacent emission areas EA.

For example, the color filter pattern 250 can be disposed to overlap with the emission area EA and have a size that is smaller than or equal to a size of the emission area EA.

However, the arrangement position and size of the color filter pattern 250 can be determined by various factors such as a distance between the color filter pattern 250 and the first electrode 241, a distance between the color filter pattern 250 and each protruding portion PP and recessed portion DP of a micro lens included in the overcoat layer 260, and a distance between an emission area EA and another emission area EA, as well as the size and position of the emission area EA.

A pixel of the electroluminescent display device 200 can include one or more subpixels. For example, a single pixel may include two to four subpixels.

Subpixel refers to a unit in which a specific type of color filter pattern 250 is formed or in which the light emitting diode D is capable of emitting a particular color without the color filter pattern 250 being formed.

Colors defined in a subpixel may include red (R), green (G), blue (B), and optionally white (W), but embodiments are not limited thereto.

Particularly, in the electroluminescent display device 200 according to the second embodiment of the present disclosure, a wall 270 can be disposed in a non-emission area outside the color filter pattern 250. Namely, the wall 270 can be formed in the non-emission area to surround the emission area EA. Alternatively, the wall 270 can be formed in portions of the non-emission area.

The wall 270 is disposed at a side of the color filter pattern 250 and has a thickness that is greater than the thickness of the color filter pattern 250.

The wall 270 can include red, blue, and green wall patterns formed of the same color filter material and disposed at the same layer as red, blue, and green color filter patterns 250.

The wall 270 can have a structure in which a plurality of wall patterns are stacked on each other. For example, the wall 270 can include at least two of the red, blue, and green wall patterns stacked on top of each other.

The wall 270 will be described in more detail below.

The overcoat layer 260 can be disposed on the color filter pattern 250, the wall 270, and the protective layer 233.

The protective layer 233 may be omitted. That is, the overcoat layer 260 may be disposed on the thin film transistor 220.

The color filter pattern 250 and the wall 270 are illustrated as being disposed on the protective layer 233, but embodiments are not limited thereto. The color filter pattern 250 and the wall 270 can be disposed at any position between the overcoat layer 260 and the substrate 210.

Due to the wall 270 being formed in the non-emission area, the overcoat layer 260 in the emission area EA of the electroluminescent display device 200 according to the second embodiment can have a thickness greater than the first thickness K1 (of FIG. 4) of the overcoat layer 160 (of FIG. 4) in the emission area EA (of FIG. 4) of the electroluminescent display device 100 (of FIG. 3) according to the first embodiment.

That is, even with an amount of material smaller than that of a material for forming the overcoat layer 160 (of FIG. 4) according to the first embodiment, a fourth thickness K4 of the overcoat layer 260 in the emission area EA according to the second embodiment can be formed to be greater than the first thickness K1 (of FIG. 4) of the overcoat layer 160 (of FIG. 4) in the emission area EA (of FIG. 4) according to the first embodiment.

Further, when the wall 270 is formed to surround the emission area EA, due to a trapping effect by the wall 270, the fourth thickness K4 of the overcoat layer 260 corresponding to the emission area EA can further be formed thicker than the first thickness K1 of the overcoat layer 160 (of FIG. 4) corresponding to the emission area EA (of FIG. 4) according to the first embodiment. In other words, the wall 270 can help hold the material of overcoat layer 260 together and help the overcoat layer 260 be built up even higher and thicker. In addition, since the wall 270 displaces more volume, the overcoat layer 260 can be made thicker even when the same amount of overcoat material is used, as compared with the first embodiment shown in FIG. 4.

To improve the light extraction efficiency in the electroluminescent display device 200 according to the second embodiment of the present disclosure, a micro lens ML can be disposed in the overcoat layer 260 corresponding to the emission area EA.

The micro lens ML can include a plurality of recessed portions DP and a plurality of protruding portions PP, but embodiments are not limited thereto, and the micro lens ML can have various other shapes.

For example, a micro lens ML including a plurality of protruding portions PP and connecting portions configured to connect adjacent protruding portions PP can be formed in the overcoat layer 260.

In an area in which the plurality of recessed portions DP and the plurality of protruding portions PP are not disposed, the overcoat layer 260 serves as a planarization layer. For example, the overcoat layer 260 in the non-emission area can have a flat top surface.

Each of the plurality of recessed portions DP may have various shapes in the plane view (e.g., when viewed from above), such as a hexagonal shape, a semicircular shape, a semielliptical shape, and a quadrilateral shape.

A pitch of the plurality of recessed portions DP can be in the range of about 4 μm to 12 μm, but it is not limited thereto.

To form the plurality of recessed portions DP and the plurality of protruding portions PP on the overcoat layer 260 corresponding to the emission area EA, a heat treatment is performed after a photoresist has been coated and patterned by a photolithography process.

Since the overcoat layer 260 of the electroluminescent display device 200 according to the second embodiment is formed to be thick in an area corresponding to the emission area EA in comparison to the first embodiment, the color filter pattern 250 can be prevented from being exposed and damaged in the heat treatment process in the process of forming the recessed portions DP on the overcoat layer 260 corresponding to the emission area EA. In other words, since the overcoat layer 260 is thicker, it can better shield and protect the color filter pattern 250 from the heat treatment process (e.g., pitting of the color filter pattern 250 can be avoided).

The light emitting diode D including the first electrode 241, the emitting layer 242, and the second electrode 243 can be disposed on the overcoat layer 260.

To block the spread of outgassing from the overcoat layer 260 to the light emitting diode D, a second protective layer having an insulating property can be disposed between the overcoat layer 260 and the first electrode 241.

Namely, the second protective layer, which follows the morphology of the plurality of recessed portions DP and the plurality of protruding portions PP of the overcoat layer 260, can be disposed between the overcoat layer 260 and the first electrode 241.

The first electrode 241 can be disposed on the overcoat layer 260.

The first electrode 241 may be an anode or cathode for supplying one of an electron or a hole to the emitting layer 242.

A situation in which the first electrode 241 of the electroluminescent display device 200 according to the second embodiment of the present disclosure is an anode will be described as an example.

The first electrode 241 can be formed of a conductive material having a relatively high work function value. For example, the first electrode 241 can be formed of a transparent conductive material such as ITO and IZO.

The first electrode 241 may be connected to the source electrode 223 of the thin film transistor 220 through a contact hole formed in the overcoat layer 260 and may be separately formed for each pixel region.

In the electroluminescent display device 200 according to the second embodiment of the present disclosure, the thin film transistor 220 is an N-type thin film transistor in which the first electrode 241 is connected to the source electrode 223, but embodiments are not limited thereto. When the thin film transistor 220 is a P-type thin film transistor, the first electrode 241 may also be connected to the drain electrode 224.

The first electrode 241 may also be electrically connected to the emitting layer 242 by being adjacent to the emitting layer 242 with a conductive material therebetween.

The first electrode 241 is disposed to follow the morphology of a surface of the overcoat layer 260. Namely, the shape of the micro lens ML is reflected onto the first electrode 241.

That is, the first electrode 241 can be disposed in a form which follows the morphology of the plurality of recessed portions DP and the plurality of protruding portions PP of the overcoat layer 260 (e.g., both can have the same bumpy or wavy pattern).

A bank layer 236 can be disposed on the overcoat layer 260 and the first electrode 241. The bank layer 236 is disposed on an edge of the first electrode 241 and has an opening 236a exposing the first electrode 241. The bank layer 236 may be disposed between adjacent pixel (or subpixel) areas and serve to differentiate the adjacent pixel (or subpixel) areas.

In this instance, the plurality of recessed portions DP and the plurality of protruding portions PP of the overcoat layer 260 can be disposed in the opening 236a of the bank layer 236.

That is, since the plurality of recessed portions DP and the plurality of protruding portions PP of the overcoat layer 260 are disposed to overlap with the color filter pattern 250, the plurality of recessed portions DP and the plurality of protruding portions PP of the overcoat layer 260 can overlap the color filter pattern 250, which is disposed below the plurality of recessed portions DP and the plurality of protruding portions PP, and overlap the opening 236a of the bank layer 236, which is disposed above the plurality of recessed portions DP and the plurality of protruding portions PP.

The emitting layer 242 can be disposed on the first electrode 241.

The emitting layer 242 may have a tandem white structure in which a plurality of emitting layers are stacked to emit white light. For example, the emitting layer 242 can include a first emitting layer configured to emit blue light and a second emitting layer disposed on the first emitting layer and configured to emit light having a color which turns white when mixed with blue. The second emitting layer can be an emitting layer configured to emit yellow-green light.

The emitting layer 242 may only include emitting layers that emit one of blue light, red light, and green light. In this instance, the electroluminescent display device 200 may not include the color filter pattern 250.

In this instance, an emitting material of the emitting layer 242 can be an organic emitting material or an inorganic emitting material, such as a quantum dot.

Also, the emitting layer 242 can have a shape which follows the morphology of the overcoat layer 260 (e.g., both can have the same bumpy or wavy pattern).

The second electrode 243 for supplying one of an electron or a hole to the emitting layer 242 may be disposed on the emitting layer 242.

In this instance, the second electrode 243 may be an anode or a cathode. A situation in which the second electrode 243 of the electroluminescent display device 200 according to the second embodiment of the present disclosure is a cathode will be described as an example.

The second electrode 243 can be formed of a conductive material having a relatively low work function value and can be located on an entire surface of a display area. For example, the second electrode 243 can be formed of Al, Mg, Ag, or an alloy thereof, but it is not limited thereto.

The second electrode 243 can have a shape which follows the morphology of the overcoat layer 260.

The first electrode 241, the emitting layer 242, and the second electrode 243 constitute the light emitting diode D, and the light emitting diode D follows the morphology of the plurality of recessed portions DP and the plurality of protruding portions PP of the overcoat layer 260 (e.g., the light emitting diode D can be shaped similar to a piece of lasagna, in which a plurality of wavy layers are stacked on top of each other).

The shape of the light emitting diode D may be realized using the plurality of recessed portions DP and the plurality of protruding portions PP of the overcoat layer 260.

Figure 7:
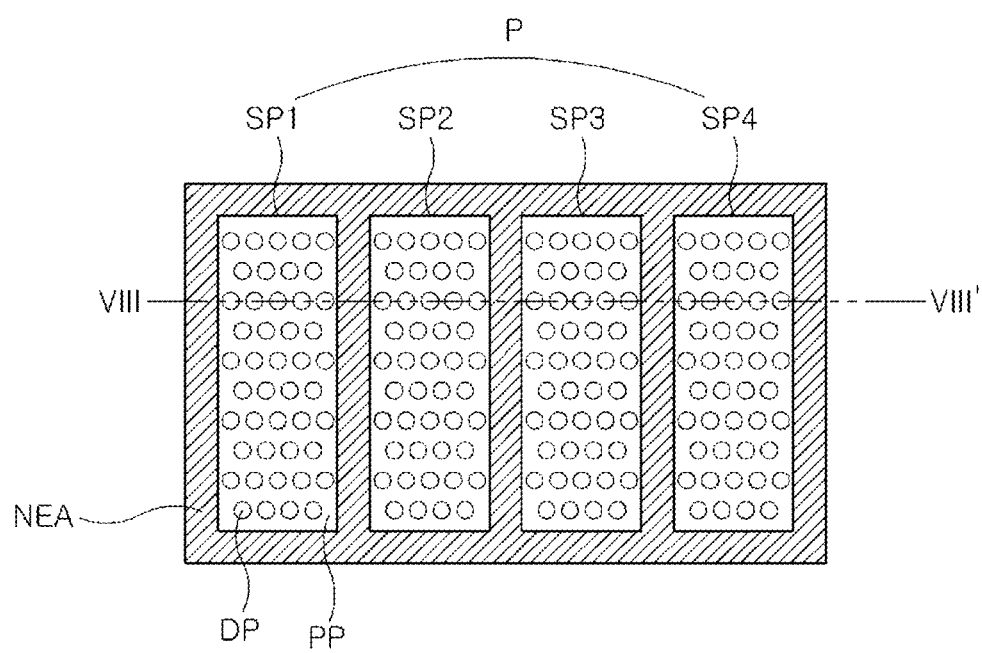
FIG. 7 is a schematic plane view of a wall formed in a single pixel of the electroluminescent display device according to an embodiment of the present disclosure.
Figure 8:
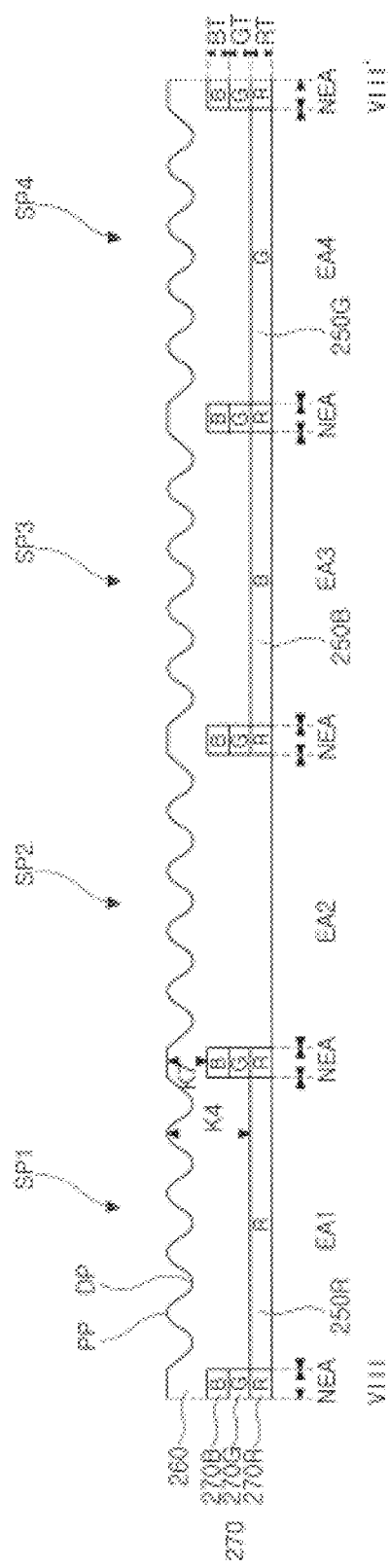
FIG. 8 is a cross-sectional view taken along line VIII-VIII of FIG. 7, according to an embodiment of the present disclosure.

FIG. 7 is a schematic plane view of a wall formed in a single pixel of the electroluminescent display device according to the second embodiment of the present disclosure, and FIG. 8 is a cross-sectional view taken along line VIII-VIII of FIG. 7.

As illustrated in FIG. 7, a pixel of the electroluminescent display device 200 according to the second embodiment of the present disclosure can include one or more subpixels. For example, a single pixel P can include first to fourth subpixels SP1, SP2, SP3, and SP4.

Each of the first to fourth subpixels SP1, SP2, SP3, and SP4 corresponds to an emission area EA.

A non-emission area NEA can be formed to surround each of the first to fourth subpixels SP1, SP2, SP3, and SP4.

Referring to FIGS. 7 and 8, a color filter pattern can be disposed in first to fourth emission areas EA1, EA2, EA3, and EA4, which respectively correspond to the first to fourth subpixels SP1, SP2. SP3, and SP4.

In this instance, the color filter pattern can be formed in all of the first to fourth emission areas EA1, EA2, EA3, and EA4 or may only be formed in some of the first to fourth emission areas EA1, EA2. EA3, and EA4.

For example, a red color filter pattern 250R can be formed in the first emission area EA1, and color filter patterns 250R, 250B, and 250G may not be formed in the second emission area EA2.

A blue color filter pattern 250B can be formed in the third emission area EA3, and a green color filter pattern 250G can be formed in the fourth emission area EA4.

In this instance, a width of the first emission area EA1 can be approximately 44 μm, a width of the second emission area EA2 can be approximately 84 μm, a width of the third emission area EA3 can be approximately 62 μm, and a width of the fourth emission area EA4 can be approximately 44 μm. Namely, the width of the first emission area EA1 can be equal to that of the fourth emission area EA4, and the width of the third emission area EA3 can be greater than the first emission area EA1 and smaller than the second emission area EA2. But, it is not limited thereto.

The red, blue, and green color filter patterns 250R, 250B, and 250G can have the same thickness. Alternatively, the red, blue, and green color filter patterns 250R, 250B, and 250G can have different thicknesses.

For example, the red, blue, and green color filter patterns 250R, 250B, and 250G can have the same thickness within the range of about 2 μm to 3 μm or have different thicknesses.

The red, blue, and green color filter patterns 250R, 250B, and 250G can be formed to overlap an emission area or formed to have a smaller area than the emission area.

A non-emission area NEA can be disposed to surround each of the first to fourth emission areas EA1, EA2, EA3, and EA4.

The wall 270 can be formed in the non-emission area NEA. The wall 270 can overlap the bank layer 236. For example, the wall 270 can be formed in all non-emission areas NEA or only be formed in some of the non-emission areas NEA. The wall can completely surround the emission area EA or partially surround the emission area EA.

Heights of walls 270 which respectively surround the first to fourth emission areas EA1, EA2, EA3, and EA4 can be equal to or differ from each other.

In this instance, the wall 270 can include red, blue, and green wall patterns 270R, 270B, and 270G which are formed of the same material and disposed at the same layer as the red, blue, and green color filter patterns 250R, 250B, and 250G.

That is, the wall 270 can have a structure in which the plurality of wall patterns 270R, 270B, and 270G are stacked. For example, the wall 270 can be formed by at least two of the red, blue, and green wall patterns 270R, 270B, and 270G being stacked on top of each other.

For example, when the red, green, and blue color filter patterns 250R, 250G, and 250B are repeatedly formed in sequence, the wall 270 includes the red wall pattern 270R and the green wall pattern 270G being stacked such that the wall 270 having a double-layered structure in the non-emission area NEA is provided. Alternatively, the wall 270 includes the red wall pattern 270R, the green wall pattern 270G, and the blue wall pattern 270B being stacked such that the wall 270 having a triple-layered structure in the non-emission area NEA is provided. The number of stacked wall patterns 270R, 270B, and 270G and the stacking order thereof may be modified in various ways.

Hereinafter, a situation in which a triple-layered structure wall 270 is formed will be described as an example.

The wall patterns 270R, 270B, and 270G can be defined as a first wall pattern, a second wall pattern, and a third wall pattern, according to the stacking order thereof.

That is, the wall patterns 270R, 270B, and 270G can be defined as a first wall pattern stacked on the top surface of the protective layer 233 (of FIG. 6), a second wall pattern stacked on the top of the first wall pattern, and a third wall pattern stacked on the top of the second wall pattern.

Namely, in FIG. 8, the red wall pattern 270R as the first wall pattern is disposed on the protective layer 233 (of FIG. 6), and the green wall pattern 270G as the second wall pattern and the blue wall pattern 270B as the third wall pattern are sequentially stacked on the red wall pattern 270R, but there is no limitation in the stack order of the red, green and blue wall patterns 270R, 270G and 270B. For example, the blue wall pattern 270B as the second wall pattern can be positioned on the green wall pattern 270G as the first wall pattern and under the red wall pattern 270R as the third wall pattern.

A thickness of the first wall pattern can be in the range of about 2 µm to 3 µm.

For example, when the first wall pattern is formed as the red wall pattern 270R, the thickness of the first wall pattern can be approximately 3 µm, and when the first wall pattern is formed as the blue wall pattern 270B or the green wall pattern 270G, the thickness of the first wall pattern can be approximately 2 µm. However, it is not limited thereto.

A thickness of each of the second wall pattern and the third wall pattern, which are stacked above the first wall pattern, can be in the range of about 0.5 µm to 1 µm.

That is, regardless of which of the red, blue, and green wall patterns 270R, 270B, and 270G forming the second wall pattern and the third wall pattern, each of the second wall pattern and the third wall pattern can be formed with a thickness in the range of about 0.5 µm to 1 µm.

For example, when the red, green, and blue wall patterns 270R, 270G, and 270B are sequentially stacked in that order, the red wall pattern 270R as the first wall pattern, may have a thickness of approximately 3 µm, and each of the green and blue wall patterns 270G and 270B as the second and third wall patterns can have a thickness in the range of about 0.5 µm to 1 µm.

When the blue, red, and green wall patterns 270B, 270R, and 270G are sequentially stacked in that order, the blue wall pattern 270B as the first wall pattern can have a thickness of approximately 2 µm, and each of the red and green wall patterns 270R and 270G as the second and third wall patterns can have a thickness in the range of about 0.5 µm to 1 µm.

When the green, red, and blue wall patterns 270G, 270R, and 270B are sequentially stacked in that order, the green wall pattern 270G as the first wall pattern may have a thickness of approximately 2 µm, and each of the red and blue wall patterns 270R and 270B as the second and third wall patterns can have a thickness in the range of about 0.5 µm to 1 µm.

However, these are merely examples, and embodiments are not limited thereto. The first to third wall patterns may be formed with the same thickness.

A width d of each of the red, green, and blue wall patterns 270R, 270G, and 270B can be in the range of about 3 µm to 5 µm, but embodiments are not limited thereto.

Particularly, since the red, blue, and green wall patterns 270R, 270B, and 270G formed in the non-emission area NEA can be formed using a process of forming the red, blue, and green color filter patterns 250R, 250B, and 250G which are formed in the emission area EA (of FIG. 6), an additional process is not required.

The overcoat layer 260 can be disposed on the color filter patterns 250R, 250B, and 250G, the protective layer 233 (of FIG. 6) and the wall 270.

Due to the wall 270 being formed in the non-emission area NEA, the fourth thickness K4 (a distance from the top surface of the color filter pattern 250 to the peak of the plurality of protruding portions PP of the overcoat layer 260, or T1 (of FIG. 8)) of the overcoat layer 260 in the emission area EA (of FIG. 6) of the electroluminescent display device 200 (of FIG. 6) according to the second embodiment can be formed to be greater than the first thickness K1 (of FIG. 4) of the overcoat layer 160 (of FIG. 4) in the emission area EA (of FIG. 4) of the electroluminescent display device 100 (of FIG. 3) according to the first embodiment.

That is, even with an amount of material smaller than that of a material for forming the overcoat layer 160 (of FIG. 4) according to the first embodiment, the overcoat layer 260 of the electroluminescent display device 200 (of FIG. 6) according to the second embodiment of the present disclosure can be formed with a thickness greater than the first thickness K1 (of FIG. 4) of the overcoat layer 160 (of FIG. 4) in the emission area EA (of FIG. 4) according to the first embodiment.

Further, when the wall 270 is formed to surround the emission area EA (of FIG. 6), due to a trapping effect by the wall 270, the fourth thickness K4 of the overcoat layer 260 in the emission area EA (of FIG. 6) can be formed even thicker than the first thickness K1 of the overcoat layer 160 (of FIG. 4) in the emission area EA (of FIG. 4) according to the first embodiment.

For example, when the wall 270 having a thickness of approximately 3 µm is formed, the fourth thickness K4 of the overcoat layer 260 according to the second embodiment can be greater by approximately 1.5 µm than the first thickness K1 of the overcoat layer 160 (of FIG. 4) according to the first embodiment.

Accordingly, the color filter pattern 250 can be prevented from being exposed and damaged in the heat treatment process in the process of forming the recessed portions DP and/or the protruding portion PP on the overcoat layer 260 corresponding to the emission area EA (of FIG. 6).

A fifth thickness K5 of the overcoat layer 260 formed in the non-emission area NEA of the electroluminescent display device 200 according to the second embodiment can be smaller than the second thickness K2 of the overcoat layer 160 (of FIG. 4) formed in the non-emission area NEA (of FIG. 4) of the electroluminescent display device 100 (of FIG. 3). However, this is not a problem since the micro lens formed of the plurality of recessed portions DP and the plurality of protruding portions PP is not formed in the overcoat layer 260 which is formed in the non-emission area NEA.

That is, the overcoat layer 260 can have a form including the plurality of recessed portions DP and the plurality of protruding portions PP in the emission area EA (of FIG. 6) and have a flat top surface in the non-emission area NEA.

The fifth thickness K5 (a distance from the top surface of the protective layer 233 to the smooth top surface of the overcoat layer 260) of the overcoat layer 260 formed in the non-emission area NEA can be smaller than or equal to a sixth thickness K6 (a distance from the top surface of the protective layer 233 to the peak of the protruding portion PP of the overcoat layer 260). Namely, a height of the overcoat layer 260 from the substrate 210 (or the protective layer 233) in the emission area EA can be greater than or equal to a height of the overcoat layer 260 from the substrate 210 (or the protective layer 233) in the non-emission area NEA.

The plurality of recessed portions DP and the plurality of protruding portions PP of the overcoat layer 260 formed in the first to fourth emission areas EA1, EA2, EA3, and EA4 have been described as having the same respective width, but embodiments are not limited thereto. The respective width of the plurality of recessed portions DP and the plurality of protruding portions PP of the overcoat layer 260 may differ from each other in the first to fourth emission areas EA1, EA2, EA3, and EA4.

That is, by forming a width of the recessed portion DP of the overcoat layer 260 or the maximum width of the protruding portion PP of the overcoat layer 260 to be smaller (e.g., more bumps and depressions, and more densely spaced), as the luminous efficiency in the first to fourth emission areas EA1, EA2, EA3, and EA4 is lower, light extraction effect can be further improved in an emission area with low efficiency.

As described above, the overcoat layer 260 including the micro lens ML formed of the plurality of recessed portions DP and the plurality of protruding portions PP is disposed in the electroluminescent display device 200 according to the second embodiment of the present disclosure. Accordingly, light, which has not been extracted to the outside due to total reflection of the light inside the first electrode 241 and the emitting layer 242, among light emitted from the emitting layer 242 can be made to travel at an angle which is smaller than a total reflection critical angle. In other words, light that would be reflected internally by a flat diode can be allowed to escape and reflected to the outside with a wavy diode according to embodiments. In this way, external luminous efficiency can be improved through multiple reflections.

Further, by disposing the wall 270 in the non-emission area NEA, a thickness K4 of the overcoat layer 260 can be increased so that exposure and damage of the color filter pattern 250 are prevented in the process of forming the recessed portions PP on the overcoat layer 260 which corresponds to the emission area EA. In this way, degradation of image quality due to damage on the color filter pattern may be prevented and pitting of the color filter pattern 250 can be prevented.

In FIG. 8, the overcoat layer 260 has a thickness K7 on the wall 270. Alternatively, the overcoat layer 260 in the non-emission area NEA can have the same height from the protective layer 233 as the wall 270 such that the overcoat layer 260 and the wall 270 may provide a flat top surface in the non-emission area NEA.

Since the wall 270 is formed of the same material as the color filter pattern 250, an additional process is not required. Also, since a smaller amount of overcoat layer-forming material is used in comparison to the first embodiment, price competitiveness can be further improved.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. An electroluminescent display device, comprising:
    a substrate including a first emission area and a first non-emission area;
    a first color filter pattern on the substrate and in the first emission area;
    a first wall disposed in the first non-emission area and surrounding the first color filter pattern;
    an overcoat layer on the first wall and the first color filter pattern and including a first micro-lens structure having a non-flat surface in the first emission area; and
    a light emitting diode on the overcoat layer and in the first emission area,
    wherein a height of the first wall from the substrate is greater than a height of the first color filter pattern from the substrate,
    wherein the first wall is formed of a same material and disposed at a same layer as the first color filter pattern or a color filter pattern in an adjacent pixel region,
    wherein the first wall is thicker than the first color filter pattern or the color filter pattern in the adjacent pixel region, and
    wherein the first wall is disposed between the substrate and the overcoat layer, and the overcoat layer in the first emission area is configured to be thicker than the overcoat layer in the first non-emission area by the first wall.

2. The electroluminescent display device according to claim 1, wherein the non-flat surface of the micro-lens structure in the overcoat layer is configured to vary a critical angle above which total internal reflection occurs to allow additional light to escape out of the electroluminescent display device.

3. The electroluminescent display device according to claim 1, further comprising:
    a second color filter pattern in a second emission area of the substrate; and
    a second wall in a second non-emission area of the substrate and surrounding the second color filter pattern,
    wherein the overcoat layer further includes a second micro-lens structure having a non-flat surface in the second emission area.

4. The electroluminescent display device according to claim 3, further comprising:
    a third color filter pattern in a third emission area of the substrate; and
    a third wall in a third non-emission area of the substrate and surrounding the third color filter pattern,
    wherein the overcoat layer further includes a third micro-lens structure having a non-flat surface in the third emission area.

5. The electroluminescent display device according to claim 4, wherein the first color filter pattern is a red color filter pattern, the second color filter pattern is a blue color filter pattern, and the third color filter pattern is a green color filter pattern.

6. The electroluminescent display device according to claim 4, wherein the first, second and third walls have a difference in a height.

7. The electroluminescent display device according to claim 4, wherein each of the first, second and third micro-lens structures includes a plurality of recessed portions and a plurality of protruding portions, and the plurality of recessed portions and the plurality of protruding portions of at least one of the micro-lens structures has a difference in a width to the plurality of recessed portions and the plurality of protruding portions of another one of the micro-lens structures.

8. The electroluminescent display device according to claim 1, wherein the first wall includes a first wall pattern and a second wall pattern on the first wall pattern, and a first thickness of the first wall pattern is greater than a second thickness of the second wall pattern.

9. The electroluminescent display device according to claim 8, wherein the first wall pattern further includes a third wall pattern between the first and second wall patterns, and a third thickness of the third wall pattern is smaller than the first thickness.

10. The electroluminescent display device according to claim 9, wherein the first wall pattern is a red wall pattern, the second wall pattern is a green wall pattern, and the third wall pattern is a blue wall pattern, and wherein a width of each of the red, green, and blue wall patterns is in a range of approximately 3 µm to 5 µm.

11. The electroluminescent display device according to claim 1, wherein the overcoat layer has a first height in the first emission area and a second height in the first non-emission area, and the second height is smaller than the first height.

12. The electroluminescent display device according to claim 1, wherein the light emitting diode includes a first electrode on the first micro-lens structure, an emitting layer on the first electrode and a second electrode on the emitting layer.

13. The electroluminescent display device according to claim 12, wherein at least one of the first electrode, the emitting layer and the second electrode has a shape that follows contours of the non-flat surface of the micro-lens structure in the overcoat layer.

14. The electroluminescent display device according to claim 13, further comprising a bank layer overlapping with an edge portion of the first electrode, wherein the first wall overlaps with a portion of the bank layer.

15. The electroluminescent display device according to claim 1, wherein a thickness of the first wall is greater than a thickness of the first color filter pattern.

16. The electroluminescent display device according to claim 1, wherein the non-flat surface of the micro-lens structure in the overcoat layer has a wavy shape or a bumpy shape.

17. The electroluminescent display device according to claim 16, wherein the light emitting diode has a wavy shape or a bumpy shape that corresponds to the wavy shape or the bumpy shape of the non-flat surface of the micro-lens structure in the overcoat layer.

18. The electroluminescent display device according to claim 1, wherein the first wall includes a first wall pattern and a second wall pattern on the first wall pattern, wherein the first wall includes a first portion at a first side of the first color filter pattern and a second portion at a second side, which is opposite to the first side, of the first color filter pattern, and wherein the first wall pattern in the first portion of the first wall is formed of a same material as the first wall pattern in the second portion of the first wall, and the second wall pattern in the first portion of the first wall is formed of a same material as the second wall pattern in the second portion of the first wall.

19. An electroluminescent display device, comprising:
a substrate including a first emission area and a first non-emission area;
a first color filter pattern on the substrate and in the first emission area;
a first wall disposed in the first non-emission area and surrounding the first color filter pattern;
an overcoat layer on the first wall and the first color filter pattern and including a first micro-lens structure having a non-flat surface in the first emission area; and
a light emitting diode on the overcoat layer and in the first emission area,
wherein the first wall includes a first wall pattern and a second wall pattern on the first wall pattern, and a first thickness of the first wall pattern is greater than a second thickness of the second wall pattern.

20. The electroluminescent display device according to claim 19, wherein the first wall includes a first portion at a first side of the first color filter pattern and a second portion at a second side, which is opposite to the first side, of the first color filter pattern, and wherein the first wall pattern in the first portion of the first wall is formed of a same material as the first wall pattern in the second portion of the first wall, and the second wall pattern in the first portion of the first wall is formed of a same material as the second wall pattern in the second portion of the first wall.

21. An electroluminescent display device, comprising:
a substrate including a first emission area and a first non-emission area;
a first color filter pattern on the substrate and in the first emission area;
a first wall disposed in the first non-emission area and surrounding the first color filter pattern;
an overcoat layer on the first wall and the first color filter pattern and including a first micro-lens structure having a non-flat surface in the first emission area; and
a light emitting diode on the overcoat layer and in the first emission area,
wherein a thickness of the first wall is greater than a thickness of the first color filter pattern,
wherein the first wall is formed of a same material and disposed at a same layer as the first color filter pattern or a color filter pattern in an adjacent pixel region,
wherein the first wall is thicker than the first color filter pattern or the color filter pattern in the adjacent pixel region, and
wherein the first wall is disposed between the substrate and the overcoat layer, and the overcoat layer in the first emission area is configured to be thicker than the overcoat layer in the first non-emission area by the first wall.

22. The electroluminescent display device according to claim 21, wherein the first wall includes a first wall pattern and a second wall pattern on the first wall pattern, wherein the first wall includes a first portion at a first side of the first color filter pattern and a second portion at a second side, which is opposite to the first side, of the first color filter pattern, and wherein the first wall pattern in the first portion of the first wall is formed of a same material as the first wall pattern in the second portion of the first wall, and the second wall pattern in the first portion of the first wall is formed of a same material as the second wall pattern in the second portion of the first wall.

* * * * *